Dec. 27, 1966 K. E. PERRY 3,295,069
OSCILLATION GENERATOR EMBODYING COMPLEMENTARY DIFFERENTIAL AMPLIFIER PAIRS
Filed Sept. 9, 1965
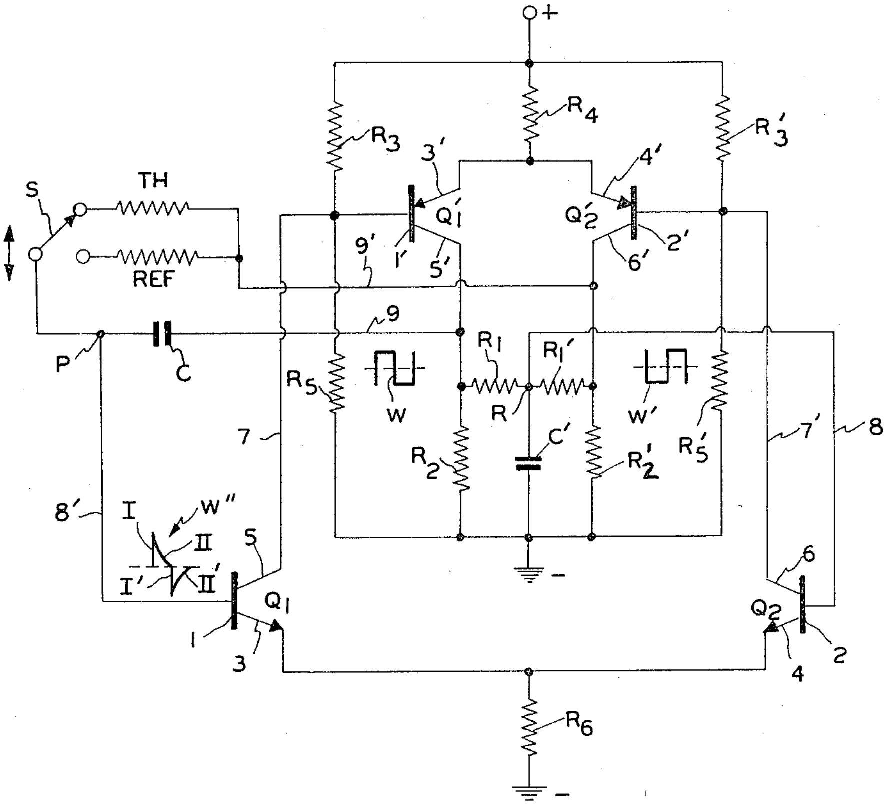
INVENTOR
KENNETH E. PERRY
BY Rines and Rines
ATTORNEYS 3,295,069

OSCILLATION GENERATOR EMBODYING COMPLEMENTARY DIFFERENTIAL AMPLIFIER PAIRS

Kenneth E. Perry, Wayland, Mass., assignor to Geodyne Corporation, Waltham, Mass., a corporation of Massachusetts Filed Sept. 9, 1965, Ser. No. 486,180
10 Claims. (Cl. 331—113)

The present invention relates to oscillation generators and, more specifically, to oscillator circuits embodying complementary differential amplifier pairs.

Pairs of switching amplifiers and other relays of the multivibrator type, including flip-flops and the like, have long been used to generate oscillations under the control of two sets of time-constant-controlled energy-storage-and-discharge networks (usually resistance-capacitance networks) intercoupling the inputs and outputs of each amplifier of the pair, the time constants determining when each amplifier switches from conduction to non-conduction and correspondingly switches the other amplifier of the pair from non-conduction to conduction, respectively. There are occasions, however, where, for purposes of economy, compactness, size and for other reasons, it would be advantageous to use only one such network; such as, for example, where network elements comprise expensive sensors or the like, including thermistors and similar impedance elements. Though blocking-type oscillators do have the advantage of requiring only one set of frequency-determining network elements, they inherently do not produce a symmetrical oscillation output.

It is to the provision of a switching-pair oscillator adapted to operate with but a single time-constant-controlling network and producing, preferably, a symmetrical output, that the present invention is primarily directed.

A further object of the invention is to provide, in general, a new and improved oscillator.

Still another object is to provide a novel oscillator circuit that, in summary, embodies complementary differential amplifier pairs, one driving the other; and the other, through novel means, providing control of the first.

Other and further objects will be explained hereinafter and will be more fully pointed out in the appended claims.

The invention will now be described with reference to the accompanying drawing, the single figure of which is a schematic circuit diagram of a preferred embodiment.

First and second pairs of complementary differential switching amplifiers are shown at $Q_1$–$Q_2$ and $Q_1'$–$Q_2'$, being illustrated as of the transistor relay type (NPN and PNP, respectively), though other types of appropriate relay devices may also be employed. The emitters 3' and 4' of the respective amplifiers $Q_1'$ and $Q_2'$ of the upper pair are connected through a common emitter resistor $R_4$ to the positive terminal + of the supply source, while the corresponding collectors 5' and 6' are connected through respective collector output-circuit resistors $R_2$ and $R_2'$ to the preferably grounded supply terminal —. The respective base electrodes 1' and 2' of transistors $Q_1'$ and $Q_2'$ are connected in their input circuits intermediate respective voltage-divider resistors $R_3$–$R_5$ and $R_3'$–$R_5'$ extending between the + and — supply terminals. The collectors 5' and 6', moreover, are interconnected by similar series-connected resistors $R_1$ and $R_1'$, the intermediate junction R between which may be by-passed to ground by filter capacitor C'.

The lower or driving pair $Q_1$–$Q_2$ is connected with respective emitters 3 and 4 returned to the — terminal through a common resistor $R_6$, and with the colectors 5 and 6 respectively connected by output-circuit conductors

7 and 7' symmetrically and complementarily to drive the input-circuit bases 1' and 2' of respective transistors $Q_1'$ and $Q_2'$ of the upper pair.

It will be observed that the base 2 of transistor $Q_2$ is connected by conductor 8 to the junction point R, so that the direct-current reference level of the base 2 is maintained at that of point R. The base 1 of transistor $Q_1$, on the other hand, receives feedback along its input-circuit conductor 8' from each of the collectors 5' and 6' of $Q_1'$ and $Q_2'$; positive feedback from the output circuit of $Q_1'$ via conductor 9 and network storage capacitor C, and a negative feedback from the output circuit of $Q_2'$ via conductor 9' and either of network resistors TH or REF, depending upon the position of switch S. Point P is the common intermediate terminal of network TH–C or REF–C to which conductor 8' connects.

By virtue of the above-described interconnections, only one transistor of each differentially connected pair will be switched into conduction at a time, with the transistors of each pair complementing, as later described; the transistor relays $Q_1$ and $Q_2$ operating as a current-mode or current-steering pair, alternately applying, along their respective output-circuit conductors 7 and 7', complementary signals for alternately symmetrically driving the bases 1' and 2' of relays $Q_1'$ and $Q_2'$ to permit alternating switching conduction thereof. Complementary symmetrical square-wave outputs result from the alternate switching of $Q_1'$ and $Q_2'$ at the collectors 5' and 6' (acting as a current source) as shown at W and W' to the left of resistor $R_1$ and to the right of resistor $R_1'$, respectively. By proper balancing of transistors and the use of symmetrical resistance values $R_1$, $R_1'$, etc., a D.C. reference level is established at R between the highest positive and lowest negative levels of waves W and W', such as midway therebetween, as shown by the dotted horizontal line on waveform W'. As before stated, conductor 8 insures that the base 2 of $Q_2$ is always maintained at that intermediate reference level.

The feedback path 9 applies a portion of the square-wave output signal of waveform W to network capacitor C; and positive feedback along 8' to the base 1 of $Q_1$, causes the spike switching at I in the waveform W'', shown to the left of the base 1 in the drawing. This controls the switching of transistor relay $Q_1$. After such switching, in view of the negative feedback path 9' from collector 6' through network resistance TH (in the position of switch S that is illustrated) to point P, capacitor C will charge negatively or discharge in the manner shown at II in waveform W'' under control of the time constant of the network TH–C. Then, a negative switching spike I' will be produced in response to subsequent feedback at 9–8', followed by a symmetrical positive charging of C, as at II', and producing a symmetrical oscillation, the frequency of which is controlled by the values of the elements of the single network TH–C.

If, now, TH is a thermistor or other sensor the resistance of which varies in response to some phenomenon such as temperature, the frequency of the oscillator of the invention will be correspondingly automatically changed. Similar remarks, of course, apply to varying C or whatever other energy-storage element, including inductance, may be used. Thus the desired end of a symmetrical switching-pair oscillator with but a single frequency-determining network has been achieved.

More than this, however, since only enough voltage swing is required to make sure that one of current-steering transistors $Q_1$–$Q_2$ is completely off, the values of $R_1$ and $R_1'$ can be made small to lower the amount of voltage swing. In view of the insurance that the reference level at R (and base 2) will always be mid-way between the upper and lower switching levels, the voltage across the thermistor TH can thus be most beneficially made arbitrarily small.

By operating switch S back and forth, as schematically illustrated by the arrow thereat, the frequency when the thermistor TH is in the network can be readily compared with that when a standard known reference resistance REF is substituted in the frequency-determining network. The resulting ratio of frequencies is thus a measure of the ratio of resistances (inverse); such that this frequency ratio, in accordance with the invention, enables the determination of the resistance value of TH and thus the value of the temperature or other phenomenon sensed thereby, without the need for precision frequency-determining network elements or regulated voltages or highly stable oscillation frequency.

Further modifications will also occur to those skilled in the art, and all such are considered to fall within the spirit and scope of the invention as defined in the appended claims.

What is claimed is:

1. An oscillator circuit having, in combination, two pairs of complementary current-mode-operated differential switching relays each relay of which is provided with input and output circuits, means for connecting the output circuits of one of the pairs to the input circuits of the other pair to drive the same, a positive feedback path connected from the output circuit of one relay of the said other pair to the input circuit of one relay of the said one pair, and a negative feedback path connected from the output circuit of the other relay of the said other pair to the input circuit of one relay of the said one pair, the feedback paths containing a time-constant-controlled frequency-determining network.

2. An oscillator circuit as claimed in claim 1 and in which the network comprises an energy-storage element and a resistive element, one connected in each of the said feedback paths and sharing a common terminal.

3. An oscillator circuit as claimed in claim 2 and in which the energy-storage element is disposed in the said positive feedback path and the resistive element in the said negative feedback path.

4. An oscillator circuit as claimed in claim 1 and in which the said pairs respectively comprise NPN and PNP type transistor relays.

5. An oscillator circuit as claimed in claim 4 and in which the said output circuits of the said other pair are interconnected by a pair of series-connected similar resistors the connective junction of which forms a common direct-current reference level point.

6. An oscillator circuit as claimed in claim 5 and in which the feedback paths are connected to the input circuit of the same one relay of the said one pair, and a further connection is provided from the said junction to the input circuit of the other relay of the said one pair.

7. An oscillator circuit having, in combination, two pairs of complementary current-mode-operated differential switching relays each relay of which is provided with input and output circuits, means for connecting the output circuits of one of the pairs to the input circuits of the other pair to drive the same, a positive feedback path connected from the output circuit of one relay of the said other pair to the input circuit of one relay of the said one pair, a negative feedback path connected from the output circuit of the other relay of the said other pair to the input circuit of said one relay of the said one pair, the feedback paths containing a time-constant-controlled frequency-determining network, and means for connecting the input circuit of the other relay of the said one pair to a common reference point of the output circuits of the said other pair.

8. An oscillator circuit as claimed in claim 7 and in which means is provided for switching different network elements into and out of the said network to produce correspondingly different oscillator circuit frequencies.

9. An oscillator circuit as claimed in claim 8 and in which one of the said elements is a known reference element and the other element is unknown, the ratio of the resulting said different oscillator circuit frequencies being a measure of the said unknown.

10. An oscillator circuit as claimed in claim 8 and in which one of the said elements comprises a thermistor and another element comprises a reference resistance.

No reference cited.

ROY LAKE, *Primary Examiner.*

J. KOMINSKI, *Assistant Examiner.*